United States Patent
Krasulick et al.

(10) Patent No.: US 9,709,735 B2
(45) Date of Patent: Jul. 18, 2017

(54) METHOD AND SYSTEM FOR HETEROGENEOUS SUBSTRATE BONDING FOR PHOTONIC INTEGRATION

(71) Applicant: Skorpios Technologies, Inc., Albuquerque, NM (US)

(72) Inventors: Stephen B. Krasulick, Albuquerque, NM (US); John Dallesasse, Geneva, IL (US)

(73) Assignee: Skorpios Technologies, Inc., Albuquerque, NM (US)

( * ) Notice: Subject to any disclaimer, the term of this patent is extended or adjusted under 35 U.S.C. 154(b) by 0 days.

(21) Appl. No.: 14/880,936

(22) Filed: Oct. 12, 2015

(65) Prior Publication Data

US 2016/0202415 A1    Jul. 14, 2016

Related U.S. Application Data

(60) Continuation of application No. 14/135,006, filed on Dec. 19, 2013, now Pat. No. 9,190,400, which is a
(Continued)

(51) Int. Cl.
*H01L 25/00* (2006.01)
*G02B 6/122* (2006.01)
(Continued)

(52) U.S. Cl.
CPC ....... *G02B 6/1225* (2013.01); *G02B 6/12002* (2013.01); *G02B 6/136* (2013.01);
(Continued)

(58) Field of Classification Search
CPC ... H01L 25/167; H01L 25/0753; H01L 25/50; H01L 25/162; H01L 25/165;
(Continued)

(56) References Cited

U.S. PATENT DOCUMENTS 4,293,826 A    10/1981    Scifres et al.
5,190,883 A    3/1993    Menigaux et al.
(Continued)

FOREIGN PATENT DOCUMENTS

EP    2648906 A1    10/2013
JP    2013/507792 A    4/2013
(Continued)

OTHER PUBLICATIONS

Analui et al., "A Fully integrated 20-Gb/s Optoelectronic Transceiver Implemented in a Standard 0.13-mu-m CMOS SOI Technology"; IEEE Journal of Solid State Circuits; vol. 41, No. 12; Dec. 2006; [Retrieved on Jan. 6, 2014. Retrieved from the Internet <http://ieeexplore.ieee.org/xpls/abs_all.jsp?arnumber=4014595&tag=1>; 11 pages.
(Continued)

*Primary Examiner* — Chuong A Luu
*Assistant Examiner* — Rodolfo D Fortich
(74) *Attorney, Agent, or Firm* — Kilpatrick Townsend & Stockton LLP (57) ABSTRACT

A method of fabricating a composite integrated optical device includes providing a substrate comprising a silicon layer, forming a waveguide in the silicon layer, and forming a layer comprising a metal material coupled to the silicon layer. The method also includes providing an optical detector, forming a metal-assisted bond between the metal material and a first portion of the optical detector, forming a direct semiconductor-semiconductor bond between the waveguide, and a second portion of the optical detector.

19 Claims, 7 Drawing Sheets

Related U.S. Application Data division of application No. 12/902,621, filed on Oct. 12, 2010, now Pat. No. 8,630,326.

(60) Provisional application No. 61/251,132, filed on Oct. 13, 2009.

(51) Int. Cl.

| | | |
|---|---|---|
| *G02B 6/12* | (2006.01) | |
| *G02B 6/136* | (2006.01) | |
| *H01S 5/022* | (2006.01) | |
| *H01L 25/16* | (2006.01) | |
| H01L 33/00 | (2010.01) | |
| H01L 33/44 | (2010.01) | |
| H01L 33/48 | (2010.01) | |
| H01L 33/62 | (2010.01) | |
| H01S 5/02 | (2006.01) | |

(52) U.S. Cl.
CPC ............ *H01L 25/167* (2013.01); *H01L 25/50* (2013.01); *H01S 5/02272* (2013.01); *G02B 2006/12061* (2013.01); *G02B 2006/12147* (2013.01); *H01L 33/0079* (2013.01); *H01L 33/44* (2013.01); *H01L 33/486* (2013.01); *H01L 33/62* (2013.01); *H01L 2924/0002* (2013.01); *H01S 5/021* (2013.01)

(58) Field of Classification Search
CPC ..... H01L 25/0657; H01L 25/13; H01L 25/00; H01L 25/16
USPC .................... 438/26, 23, 25, 27, 22
See application file for complete search history.

(56) References Cited

U.S. PATENT DOCUMENTS

| | | | |
|---|---|---|---|
| 5,319,667 A | 6/1994 | Dutting et al. | |
| 5,333,219 A | 7/1994 | Kuznetsov | |
| 5,838,070 A | 11/1998 | Naruse et al. | |
| 5,858,814 A | 1/1999 | Goossen et al. | |
| 5,981,400 A | 11/1999 | Lo | |
| 5,987,050 A | 11/1999 | Doerr et al. | |
| 6,101,210 A | 8/2000 | Bestwick et al. | |
| 6,192,058 B1 | 2/2001 | Abeles | |
| 6,714,566 B1 | 3/2004 | Coldren et al. | |
| 6,728,279 B1 | 4/2004 | Sarlet et al. | |
| 7,058,096 B2 | 6/2006 | Sarlet et al. | |
| 7,257,283 B1 | 8/2007 | Liu et al. | |
| 7,633,988 B2 | 12/2009 | Fish et al. | |
| 7,972,875 B2 | 7/2011 | Rogers et al. | |
| 8,106,379 B2 | 1/2012 | Bowers | |
| 8,222,084 B2 | 7/2012 | Dallesasse et al. | |
| 8,290,014 B2 | 10/2012 | Junesand et al. | |
| 8,368,995 B2 | 2/2013 | Dallesasse et al. | |
| 8,445,326 B2 | 5/2013 | Dallesasse et al. | |
| 8,559,470 B2 | 10/2013 | Dallesasse et al. | |
| 8,605,766 B2 | 12/2013 | Dallesasse et al. | |
| 8,611,388 B2 | 12/2013 | Krasulick et al. | |
| 8,615,025 B2 | 12/2013 | Dallesasse et al. | |
| 8,630,326 B2 | 1/2014 | Krasulick et al. | |
| 2002/0197013 A1 | 12/2002 | Liu et al. | |
| 2003/0042494 A1 | 3/2003 | Worley | |
| 2003/0128724 A1 | 7/2003 | Morthier | |
| 2004/0037342 A1 | 2/2004 | Blauvelt et al. | |
| 2004/0077135 A1 | 4/2004 | Fan et al. | |
| 2004/0182914 A1 | 9/2004 | Venugopalan | |
| 2004/0228384 A1 | 11/2004 | Oh et al. | |
| 2004/0259279 A1 | 12/2004 | Erchak et al. | |
| 2005/0211993 A1 | 9/2005 | Sano et al. | |
| 2005/0213618 A1 | 9/2005 | Sochava et al. | |
| 2005/0226284 A1 | 10/2005 | Tanaka et al. | |
| 2006/0002443 A1 | 1/2006 | Farber et al. | |
| 2006/0124954 A1* | 6/2006 | Akaishi ................. H01L 33/38 |
| | | | 257/99 |
| 2007/0002924 A1 | 1/2007 | Hutchinson et al. | |
| 2007/0280326 A1 | 12/2007 | Piede et al. | |
| 2009/0016399 A1 | 1/2009 | Bowers | |
| 2009/0135861 A1 | 5/2009 | Webster et al. | |
| 2009/0267173 A1 | 10/2009 | Takahashi et al. | |
| 2009/0278233 A1 | 11/2009 | Pinnington et al. | |
| 2009/0294803 A1 | 12/2009 | Nuzzo et al. | |
| 2010/0111128 A1* | 5/2010 | Qin ..................... B82Y 20/00 |
| | | | 372/46.01 |
| 2011/0012261 A1 | 1/2011 | Choi et al. | |
| 2011/0085572 A1 | 4/2011 | Dallesasse et al. | |
| 2011/0085577 A1 | 4/2011 | Krasulick et al. | |
| 2011/0089524 A1 | 4/2011 | Nonogaki | |
| 2011/0163444 A1 | 7/2011 | Hayashi | |
| 2011/0165707 A1 | 7/2011 | Lott et al. | |
| 2011/0211604 A1 | 9/2011 | Roscher | |
| 2011/0267676 A1 | 11/2011 | Dallesasse et al. | |
| 2012/0001166 A1 | 1/2012 | Doany et al. | |
| 2012/0002694 A1 | 1/2012 | Bowers et al. | |
| 2012/0057079 A1 | 3/2012 | Dallesasse et al. | |
| 2012/0057609 A1 | 3/2012 | Dallesasse et al. | |
| 2012/0057610 A1 | 3/2012 | Dallesasse et al. | |
| 2012/0057816 A1 | 3/2012 | Krasulick et al. | |
| 2012/0120978 A1 | 5/2012 | Budd et al. | |
| 2012/0149148 A1 | 6/2012 | Dallesasse et al. | |
| 2012/0170931 A1 | 7/2012 | Evans et al. | |
| 2012/0189317 A1 | 7/2012 | Heck et al. | |
| 2012/0264256 A1 | 10/2012 | Dallesasse et al. | |
| 2012/0320939 A1 | 12/2012 | Baets et al. | |
| 2013/0037905 A1 | 2/2013 | Shubin et al. | |
| 2013/0302920 A1 | 11/2013 | Dallesasse et al. | |

FOREIGN PATENT DOCUMENTS

| | | |
|---|---|---|
| TW | 2011/40975 A | 11/2011 |
| WO | 2011/046898 A1 | 4/2011 |
| WO | 2012/078361 A1 | 6/2012 |
| WO | 2014/025824 A2 | 2/2014 |

OTHER PUBLICATIONS

Non-final Office Action for U.S. Appl. No. 12/903,025 mailed on Dec. 29, 2011; 12 pages.

Non-Final office Action for U.S. Appl. No. 13/040,154 mailed on Jan. 31, 2012; 13 pages.

Non-Final Office Action for U.S. Appl. No. 13/040,179 mailed on Mar. 13, 2012; 13 pages.

Notification of Transmittal of the International Search Report and the Written Opinion of the International Searching Authority, or the Declaration; International Search Report and Written Opinion of the international Searching Authority for International Application No. PCT/US2011/061951 mailed Mar. 21, 2012; 11 pages.

Notice of Allowance for U.S. Appl. No. 13/112,142 mailed on Mar. 20, 2012; 8 pages.

Final Office Action for U.S. Appl. No. 12/903,025 mailed on May 16, 2012; 14 pages.

Final Office Action for U.S. Appl. No. 13/040,154 mailed on May 16, 2012; 14 pages.

Restriction Requirement for U.S. Appl. No. 12/902,621 mailed on May 17, 2012; 8 pages.

Non-Final Office Action for U.S. Appl. No. 13/040,181 mailed on May 22, 2012; 12 pages.

Final Office Action for U.S. Appl. No. 13/040,179 mailed on Aug. 13, 2012; 15 pages.

Non-Final Office Action for U.S. Appl. No. 13/527,394 mailed on Aug. 31, 2012; 6 pages.

Non-Final Office Action for U.S. Appl. No. 12/902,621 mailed on Sep. 18, 2012; 14 pages.

Notice of Allowance for U.S. Appl. No. 13/076,205 mailed on Sep. 19, 2012; 9 pages.

Non-Final Office Action for U.S. Appl. No. 13/040,154 mailed on Dec. 4, 2012; 15 pages.

Non-Final Office Action for U.S. Appl. No. 12/903,025 mailed on Dec. 5, 2012; 13 pages.

(56) References Cited

OTHER PUBLICATIONS

Final Office Action for U.S. Appl. No. 13/040,181 mailed on Dec. 5, 2012; 12 pages.
Non-Final Office Action for U.S. Appl. No. 13/040,179 mailed on Dec. 12, 2012; 14 pages.
Restriction Requirement for U.S. Appl. No. 13/040,184 mailed on Dec. 21, 2012; 8 pages.
Notice of Allowance for U.S. Appl. No. 13/527,394 mailed on Jan. 29, 2013; 8 pages.
Non-Final Office Action for U.S. Appl. No. 12/902,621 mailed on Apr. 23, 2013; 13 pages.
Non-Final Office Action for U.S. Appl. No. 13/040,184 mailed on Apr. 23, 2013; 16 pages.
Final Office Action for U.S. Appl. No. 12/903,025 mailed on May 29, 2013; 10 pages.
Notice of Allowance for U.S. Appl. No. 13/040,179 mailed on Jun. 12, 2013; 9 pages.
Final Office Action for U.S. Appl. No. 13/040,154 mailed on Jun. 17, 2013; 11 pages.
Notice of Allowance for U.S. Appl. No. 13/040,154 mailed on Jul. 26, 2013; 4 pages.
Notice of Allowance for U.S. Appl. No. 12/903,025 mailed on Aug. 8, 2013; 9 pages.
Non-Final Office Action for U.S. Appl. No. 13/869,408 mailed on Aug. 30, 2013; 5 pages.
Notice of Allowance for U.S. Appl. No. 12/902,621 mailed on Oct. 2, 2013; 12 pages.
Notice of Allowance for U.S. Appl. No. 13/040,184 mailed on Oct. 4, 2013; 11 pages.
Notice of Allowance for U.S. Appl. No. 13/869,408 mailed on Jan. 6, 2014.
Notification of Transmittal of the International Search Report and the Written Opinion of the International Searching Authority, or the Declaration; International Search Report and the Written Opinion of the International Searching Authority for International Application No. PCT/US2013/053856 mailed Jan. 29, 2014; 8 pages.
Notice of Allowance for U.S. Appl. No. 13/040,181 mailed on Jun. 16, 2014; 19 pages.
Coldren et al.; "Tunable Semiconductor Lasers: A Tutorial"; Journal of Lightwave Technology; Jan. 2004; vol. 22, No. 1; pp. 193-202.
Coldren; "Monolithic Tunable Diode Lasers"; IEEE Journal on Selected Topics in Quantum Electronics; Nov./Dec. 2000; vol. 6, No. 6; pp. 988-999.
Hildebrand, et al.; "The Y-Laser: A Multifunctional Device for Optical Communication Systems and Switching Networks"; Journal of Lightwave Technology, Dec. 1993; vol. 11, No. 12; pp. 2066-2075.
Isaksson et al.; "10 Gb/s Direct Modulation of 40 nm Tunable Modulated-Grating Y-Branch Laser"; in Optical Fiber Communication Conference and Exposition and the National Fiber Optic Engineers Conference; Technical Digest (CD) (Optical Society of America, 2005), paper OTuE2.
Kuznetsov et al.; "Asymmetric Y-Branch Tunable Semiconductor Laser with 1.0 THz Tuning Range"; IEEE Photonics Technology Letters, Oct. 1992; vol. 4, No. 10; pp. 1093-1095.
Laroy et al.; "Characteristics of the New Modulated Grating Y laser (MG-Y) for Future WDM Networks"; Proceedings Symposium IEEE/LEOS Benelux Chapter; 2003; Enschede; pp. 55-58, retrieved from the Internet: <http://leosbenelux.org/symp03/s03p055.pdf>.
Laroy; "New Concepts of Wavelength Tunable Laser Diodes for Future Telecom Networks"; [dissertation] Universiteit Gent, 2006 [in Dutch and English]; 162 pages.
Laroy; "New Widely Tunable Laser Concepts for Future Telecommunication Networks"; FTW-symposium, Belgium; 2002; retrieved from the Internet: <http://photonics.intec.ugent.be/download/pub1625.pdf>; 2 pages total.
Magno et al.; "Multiphysics Investigation of Thermo-optic Effect in Silicon-on-Insulator Waveguide Arrays"; Excerpt from the Proceedings of the COM SOL Users Conference 2006; retrieved from the Internet: <http:/lcds.comsol.com/access/dl/papers/1628/Magno.pdf>; 6 pages total.
Morthier et al.; "New Widely Tunable Edge-Emitting Laser Diodes at 1.55 1-1m Developed in the European 1ST-project NEWTON"; Semiconductor and Organic Optoelectronic Materials and Devices; Edited by Zah, Chung-En; Luo, Yi; Tsuji, Shinji. Proceedings of the SPIE, 2005; 5624:1-8; retrieved from the Internet: <http://photonics.intec.ugent.be/download/pub1800.pdf>.
Morthier; "Advanced Widely Tunable Edge-Emitting Laser Diodes and Their Application in Optical Communications"; [presentation]; Ghent University—IMEC; 2000; 23 pages total; Can be retrieved from the Internet: <broadband02.ici.ro/program/morthier3a.ppt>.
Morthier; "New Widely Tunable Lasers for Optical Networks;" NEWTON Project No. IST-2000-28244; Dec. 2001; retrieved from the Internet: <http://www.istoptimist.unibo.iUpdf/network!projectspublic/NEWTON/Deliverables/D01.pdf>; 5 pages total.
Passaro, et al.; "Investigation of Thermo-Optic Effect and Multi reflector Tunable Filter/Multiplexer in SOI Waveguides"; Optics Express, May 2, 2005; vol. 13, No. 9; pp. 3429-3437.
Wesstrom, et al.; "Design of a Widely Tunable Modulated Grating Y-branch Laser Using the Additive Vernier Effect for Improved Super-Mode Selection"; IEEE 18th International Semiconductor Laser Conference; 2002, pp. 99-100; retrieved from the Internet: <http://photonics.intec.ugent.be/download/pub1603.pdf>.
Wesstrom, et al.; "State-of-the-Art Performance of Widely Tunable Modulated Grating Y Branch Lasers"; Optical Fiber Communication Conference, Technical Digest (CD) (Optical Society of America, 2004), paper TuE2.

\* cited by examiner

METHOD AND SYSTEM FOR HETEROGENEOUS SUBSTRATE BONDING FOR PHOTONIC INTEGRATION

CROSS-REFERENCES TO RELATED APPLICATIONS

This application is a continuation of U.S. patent application Ser. No. 14/135,006, filed on Dec. 19, 2013, entitled "METHOD AND SYSTEM FOR HETEROGENEOUS SUBSTRATE BONDING FOR PHOTONIC INTEGRATION," which application is a division of U.S. patent application Ser. No. 12/902,621, filed on Oct. 12, 2010, entitled "METHOD AND SYSTEM OF HETEROGENEOUS SUBSTRATE BONDING FOR PHOTONIC INTEGRATION," now U.S. Pat. No. 8,630,326, issued on Jan. 14, 2014, which application claims priority to U.S. Provisional Patent Application No. 61/251,132, filed on Oct. 13, 2009, entitled "HETEROGENEOUS WAFER BONDING FOR PHOTONIC INTEGRATION," the disclosures of which are hereby incorporated by reference in their entirety for all purposes. Additionally, the disclosure of U.S. Pat. No. 8,611,388 is hereby incorporated by reference in its entirety for all purposes.

BACKGROUND OF THE INVENTION

Silicon integrated circuits ("ICs") have dominated the development of electronics and many technologies based upon silicon processing have been developed over the years. Their continued refinement led to nanoscale feature sizes that can be critical for making complementary metal oxide semiconductor CMOS circuits. On the other hand, silicon is not a direct bandgap materials. Although direct bandgap materials, including III-V compound semiconductor materials, such as indium phosphide, have been developed, there is a need in the art for improved methods and systems related to photonic ICs utilizing silicon substrates.

SUMMARY OF THE INVENTION

According to an embodiment of the present invention, techniques related to semiconductor fabrication processes are provided. Merely by way of example, embodiments of the present invention have been applied to methods and systems for bonding heterogeneous substrates for use in photonic integration applications. More particularly, an embodiment of the present invention utilizes a hybrid bonding structure including a metal/semiconductor bond and a semiconductor/semiconductor bond in order to achieve low optical loss and high electrical conductivity. The semiconductor/semiconductor bond may be an interface assisted bond. However, the scope of the present invention is broader than this application and includes other substrate bonding techniques.

According to an embodiment of the present invention, a hybrid integrated optical device is provided. The hybrid integrated optical device includes a substrate including a silicon layer and a compound semiconductor device bonded to the silicon layer. The hybrid integrated optical device also includes a bonding region disposed between the silicon layer and the compound semiconductor device. The bonding region includes a metal-semiconductor bond at a first portion of the bonding region. The metal-semiconductor bond includes a first pad bonded to the silicon layer, a bonding metal bonded to the first pad, and a second pad bonded to the bonding metal and the compound semiconductor device. The bonding region also includes an interface assisted bond at a second portion of the bonding region. The interface assisted bond includes an interface layer positioned between the silicon layer and the compound semiconductor device. The interface assisted bond provides an ohmic contact between the silicon layer and the compound semiconductor device.

According to another embodiment of the present invention, a method of fabricating a hybrid integrated optical device is provided. The method includes providing a substrate comprising a silicon layer and providing a compound semiconductor device. The method also includes forming a bonding region disposed between the silicon layer and the compound semiconductor device. The bonding region includes a metal-semiconductor bond at a first portion of the bonding region. The metal-semiconductor bond includes a first pad bonded to the silicon layer, a bonding metal bonded to the first pad, and a second pad bonded to the bonding metal and the compound semiconductor device. The bonding region also includes an interface assisted bond at a second portion of the bonding region. The interface assisted bond includes an interface layer positioned between the silicon layer and the compound semiconductor device, wherein the interface assisted bond provides an ohmic contact between the silicon layer and the compound semiconductor device.

Numerous benefits are achieved by way of the present invention over conventional techniques. For example, embodiments of the present invention provide methods and systems suitable for providing a bond with good mechanical strength, good electrical conductivity, sufficient compliance to allow the composite or hybrid bonding of semiconductor materials with different coefficients of thermal expansion with good reliability, and which also has good optical transparency. This combination of benefits allows both electrical and optical functionality across the bonded interface between two or more distinct semiconductor materials. These and other embodiments of the invention along with many of its advantages and features are described in more detail in conjunction with the text below and attached figures.

DETAILED DESCRIPTION OF SPECIFIC EMBODIMENTS

Embodiments of the present invention relate to an apparatus and method that preferably uses a bonding stress for wafer bonding and utilizes an intermediate layer to facilitate the transition from silicon and the like to another material for optical coupling as well as electron transport. Embodiments of the present invention preferably incorporate low stress, low temperature wafer bonding known in the industry and preferably comprise a thin film intermediate layer for optical coupling as well electron transport.

Figure 1:
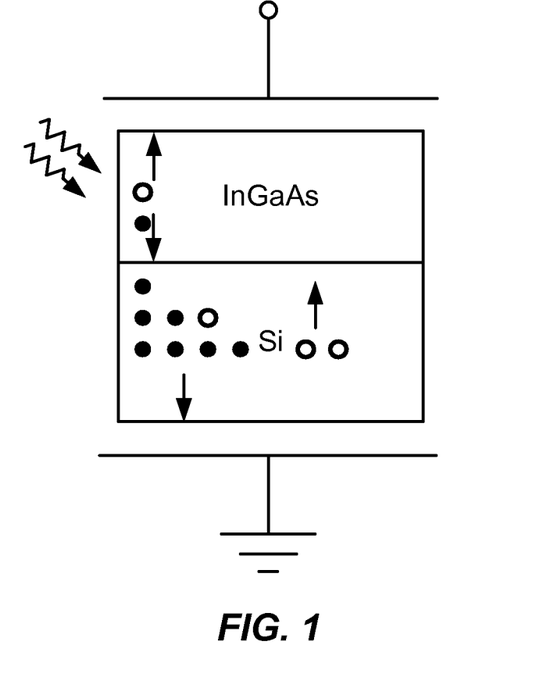
FIG. 1 illustrates an example of a photodiode with a low stress bond between a III-V substrate and a silicon substrate.
Figure 2:
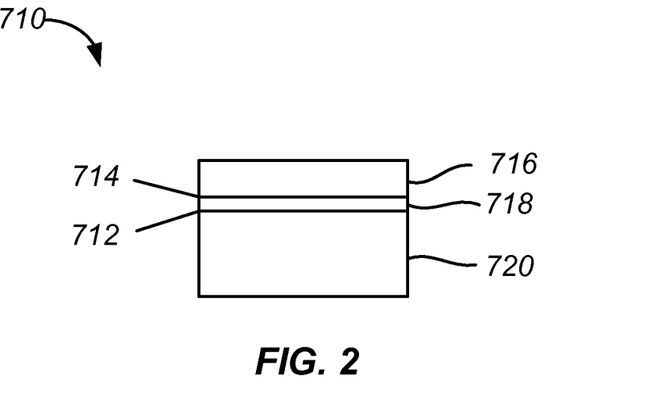
FIG. 2 illustrates a bonded structure according to an embodiment of the present invention.

FIG. 1 illustrates an example of a photodiode with a low stress bond between a III-V substrate and a silicon substrate. FIG. 2 illustrates a bonded structure according to an embodiment of the present invention. As illustrated in FIG. 2, two interfaces 712 and 714 are provided. First interface 712 is positioned between a silicon substrate 720 and an intermediate layer 718. Second interface 714 is located between intermediate layer 718 and a second semiconductor layer 716. Embodiments of the present invention are preferably used in the bonding process to facilitate integration of heterogeneous materials. Embodiments that facilitate integration preferably share the stress due to lattice mismatch between the silicon crystal and the second semiconductor that can form at these two interfaces and can be greatly reduced because of the reduced need for crystalline in the intermediate layer. The intermediate layer can be an alloy whose composition can be graded across the layer to facilitate the bonding at both interfaces 712 and 714.

Intermediate layer 718 is preferably thin, ranging from between approximately 4-5 monolayers to more than approximately 60-70 monolayers, substantially allowing the optical and thermal conduction properties to be virtually unaffected while the electron transport can preferably be achieved via actual carrier transport across the layer. In some embodiments of the present invention, intermediate layer 718 forms thermal and electric contacts at both the first interface and second interface. Embodiments of the present invention can be used in the fabrication of a plurality of high performance optoelectronic components, including but not limited to modulators, lasers, detectors, amplifiers, couplers, wavelength tunable optical components and/or circuits, combinations thereof, or the like. Embodiments as described herein are applicable to a variety of material systems including silicon as illustrated by silicon substrate 720 and/or the like and second semiconductor materials 716, which can be a compound semiconductor material. Utilizing embodiments of the present invention, heterogeneous materials (e.g., compound semiconductors and silicon substrates can be integrated on a common substrate.

The term "bandgap" as used throughout this application includes but is not limited to the energy difference between the top of the valence band and the bottom of the conduction band. The term "optical coupling" as used throughout this application includes but is not limited to placing two or more electromagnetic elements including optical waveguides close together so that the evanescent field generated by one element does not decay much before it reaches the other element. The term "electron transport" as used throughout this application includes but is not limited to an electron transport chain coupling a chemical reaction between an electron donor and an electron acceptor to the transfer of $H^+$ ions across a membrane, through a set of mediating chemical or biochemical reactions. The term "complementary metal oxide semiconductor" as used throughout this application includes but is not limited to technologies for making integrated circuits, microprocessors, microcontrollers, static RAM, digital logic circuits, analog circuits, and highly integrated transceivers.

Embodiments of the present invention optionally utilize several features of intermediate layer 718 as illustrated in FIG. 2. According to an embodiment, the thickness of the intermediate layer 718 is very thin, ranging from a few monolayers (i.e., around 10 Å in thickness) to tens of monolayers. In an embodiment, the intermediate layer is deposited using a deposition technique that provides for uniform coverage at small thicknesses. Exemplary deposition techniques include PVD, ALD, sputtering, e-beam deposition, or the like. Intermediate layer 718 is preferably deposited at relatively low temperatures ranging from temperatures less than 200° C. At these low temperatures, there preferably exist small differences of thermal expansion (i.e., differences in the coefficient of thermal expansion (CTE)) between first interface 712 and second interface 714. Intermediate layer 718 preferably forms thermal contacts at the interfaces and is preferably thermally conductive. Intermediate layer 718 preferably forms good electrical contacts at both interfaces and is preferably electrically conductive. It is not necessary to be crystalline in nature so that the lattice matching at both interfaces is not an issue. In some embodiments, intermediate layer 718 is an alloy material for which the composition varies across the layer.

Embodiments of the present invention are applicable to an apparatus that includes a semiconductor layer that is provided over an intermediate layer that is provided over a silicon substrate layer. The intermediate layer has a lower thermal conductivity than the semiconductor layer. The apparatus also includes a plurality of interfaces that are provided between the semiconductor layer and the underlying layer(s), thereby preventing crystalline lattice mismatch.

Embodiments of the present invention also include a bonding method including forming first and second bonding surfaces on first and second materials, respectively, at least one of the bonding surfaces including an intermediate layer. The method also includes enhancing activation of at least one of said first and second bonding surfaces, terminating at least one of said first and second bonding surfaces with species allowing formation of chemical and electrical bonds, and annealing said first and second materials at a temperature.

Figure 3:
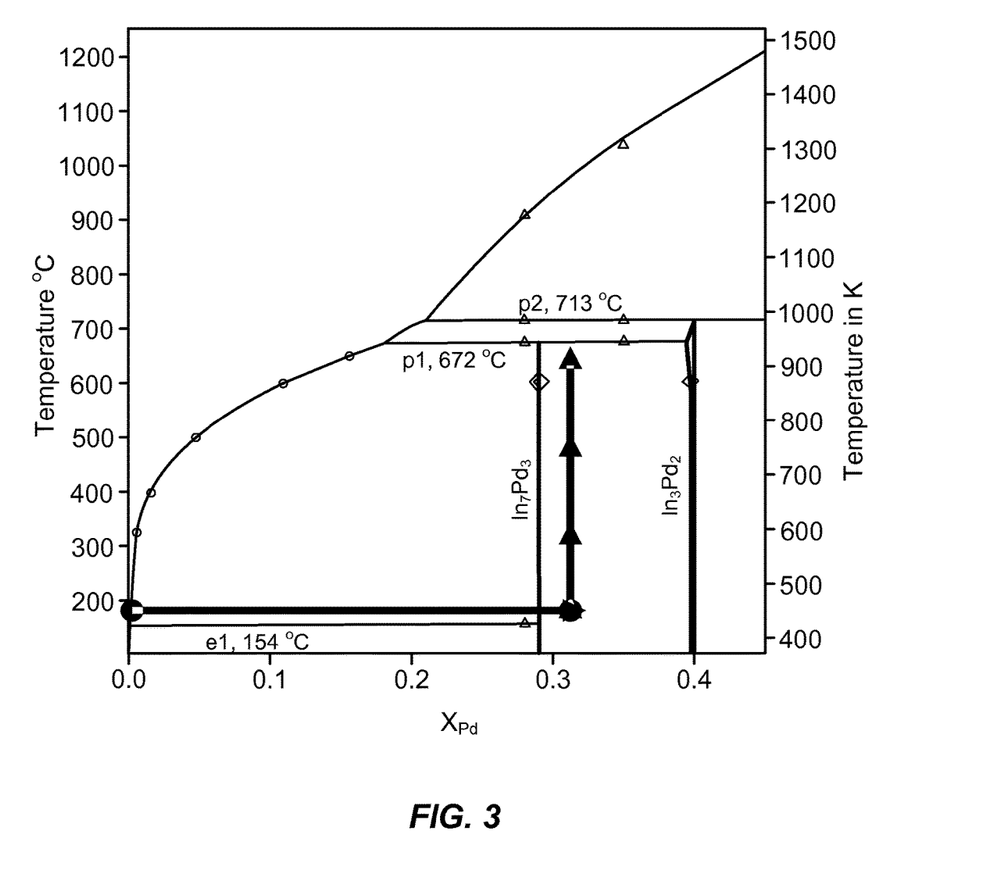
FIG. 3 illustrates a phase diagram showing alloy stability according to an embodiment of the present invention.

FIG. 3 illustrates a phase diagram showing alloy stability according to an embodiment of the present invention. As illustrated in FIG. 3, the stability of the alloy makes such an alloy suitable for use as an intermediate layer such as intermediate layer 718. In some embodiments, the alloy (e.g., $In_xPd_y$) has a small thickness to accommodate stress at the semiconductor-semiconductor interface.

While the embodiments of the invention described herein are directed to wafers used in the semiconductor industry, the invention is also applicable to thermoelectric (TE) cooling technology as well as virtually any application including optical coupling and electron transport.

Merely by way of example, an intermediate layer suitable for use according to embodiments of the present invention is $In_xPd_y$, for example, $In_{0.7}Pd_{0.3}$, which is an alloy that is stable up to very high temperatures as illustrated in FIG. 3. This alloy forms an ohmic contact at interfaces with both silicon and/or III-V materials for which the doping types at either side can be either p-type or n-type. Thus, embodiments of the present invention provide an intermediate layer that provides both ohmic contact between materials on both sides of the intermediate layer, adhesion, optical quality including transparency (i.e., low optical loss), stress accommodation, and other benefits. Other suitable alloys include germanium palladium, gold/germanium, Au/Sn, Al/Mg, Au/Si, palladium, indium/tin/silver alloys, metal alloys containing Bi, Sn, Zn, Pb, or In, combinations thereof, or the like. The optimal alloy will generally have eutectic or peritectic points, and will allow a bonding process temperature in the 350° C. to 500° C. range.

Figure 4:
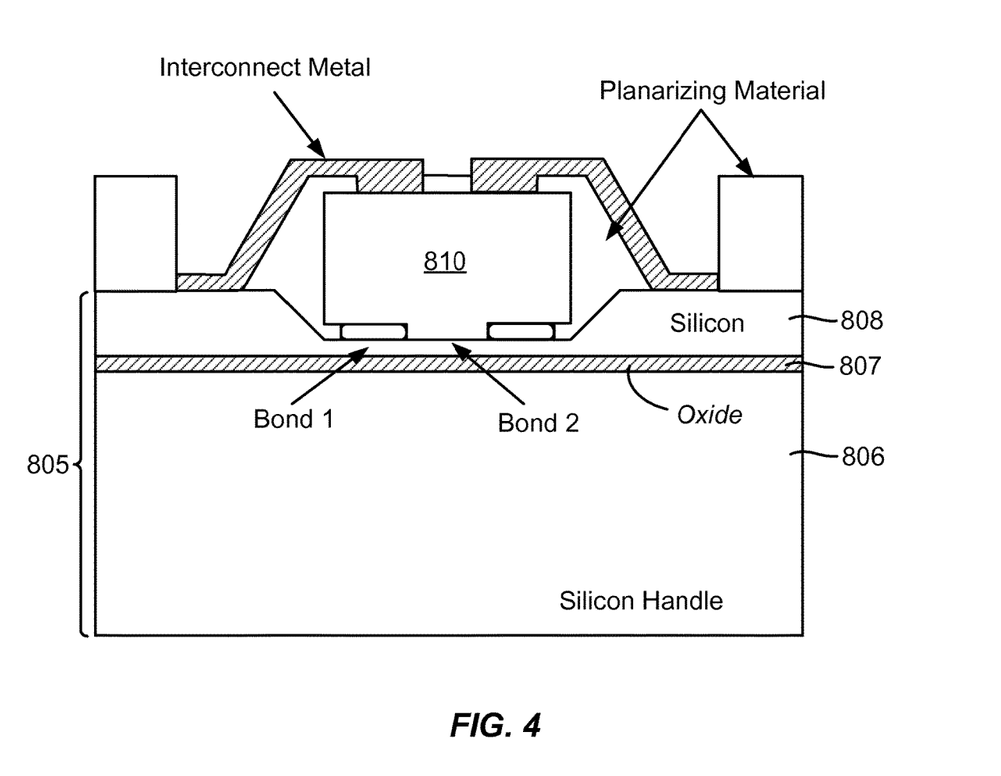
FIG. 4 is a simplified schematic diagram of a compound semiconductor structure bonded to a silicon substrate according to an embodiment of the present invention.

FIG. 4 is a simplified schematic diagram of a compound semiconductor structure bonded to a silicon substrate according to an embodiment of the present invention. Referring to FIG. 4, a composite metal/semiconductor bond is illustrated in relation to bonding of a compound semiconductor device 810 to a silicon-based substrate 805. In the embodiment illustrated in FIG. 4, the silicon-based substrate 805 is a silicon-on-insulator (SOI) substrate although this is not required by embodiments of the present invention. The SOI substrate includes a silicon handle layer 806, a silicon oxide layer 807, and a silicon layer 808, which may be single crystal silicon. Planarizing material is used in the embodiment illustrated in FIG. 4 as well as an interconnect metal that provides for electrical conductivity between portions of the compound semiconductor device 810 and the silicon layer 808 of the SOI substrate. In the embodiment illustrated in FIG. 4, the compound semiconductor device 810 extends to a height above the top surface of the silicon layer 808.

As illustrated in FIG. 4, several bonds are formed between silicon layer 808 and the compound semiconductor device 810. Bond 1 is a metal/metal bond. Associated with Bond 1, pads (not shown in FIG. 4 but illustrated in following figures) are defined on both the SOI substrate (e.g., silicon layer 808) and the compound semiconductor device 810. These pads can include an adhesion metal such as Ti or Cr and a barrier metal such as Pt or Ni. The metal used for the bonding process will typically be a eutectic solder with a eutectic point in the 350° C.-500° C. range. An example of such a eutectic solder is AuGe.

Bond 2 as illustrated in FIG. 4 can be either a direct semiconductor/semiconductor bond or a metal-assisted semiconductor/semiconductor bond. For the metal-assisted semiconductor/semiconductor bond, a thin metal layer (e.g., ranging from one to a few monolayers to a few tens of monolayers) is deposited to improve the robustness of the interface and to better accommodate the CTE differences between silicon and the compound semiconductor device. In an embodiment, the thin metal layer is less than 50 Å in thickness. The very thin interfacial metal will still allow light to pass through without significant attenuation. The direct semiconductor/semiconductor bond can be formed using techniques including either chemical activation or plasma activation of the surfaces and joining the materials together with pressure and low temperature in order to bond the two surfaces together. Direct semiconductor bonding is useful in devices employing evanescent coupling in a waveguide structure as it will have lower optical attenuation than metal-assisted semiconductor bonding.

Figure 5A:
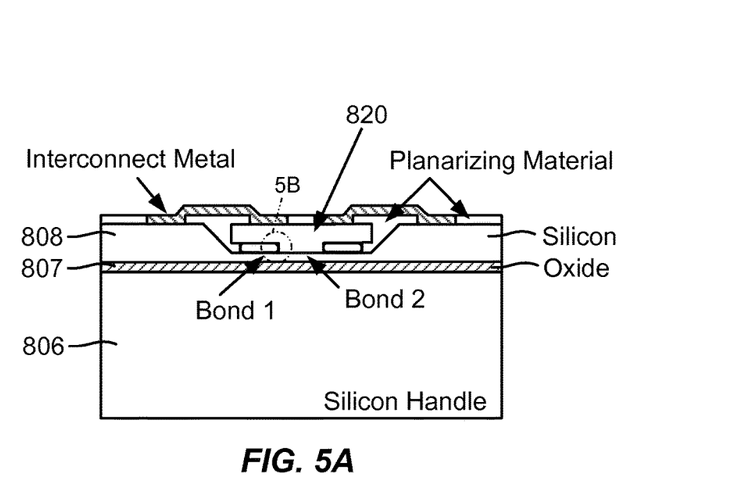
FIGS. 5A-5C are simplified schematic diagrams illustrating bond interfaces according to an embodiment of the present invention.
Figure 5B:
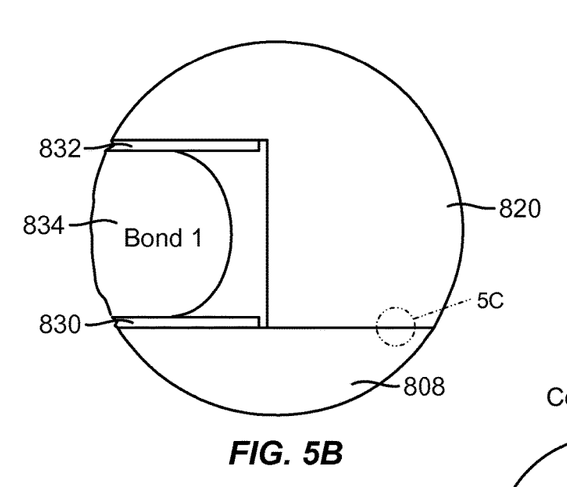
Figure 5C:
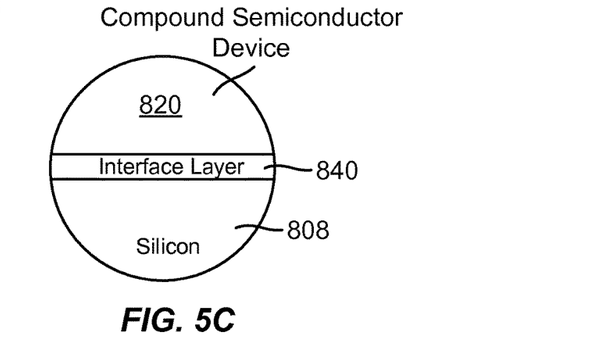

FIGS. 5A-5C are simplified schematic diagrams illustrating bond interfaces according to an embodiment of the present invention. As illustrated in FIG. 5A, the compound semiconductor device 820 has been thinned so that the top surface of the compound semiconductor device 820 is coplanar with the top surface of silicon layer 808. A planarizing material has been used to provide a planar surface extending above the top surface of silicon layer 808. Portions of the planarizing material have been removed (e.g., using a masking and etching process) and interconnect metals have been used to provide for electrical connectivity between portions of the silicon layer 808 and portions of the compound semiconductor device 820.

FIG. 5B illustrates additional details related to Bond 1 including pads 830 and 832 that provide for adhesion between the silicon layer 808, the bonding metal 834 and the compound semiconductor device 820. As discussed in relation to FIG. 4, pads 830 and 832 can include an adhesion metal such as Ti or Cr and a barrier metal such as Pt. The bonding metal 834 can be a eutectic solder such as AuGe. Other pad materials include Ni, W, refractory metals used as barrier layers in silicon-based devices, or the like, and other bonding metals include AuSn, InPd, InSn, InSnAg alloys, combinations thereof, or the like. These materials are listed merely by way of example and other materials that provide for adhesion between surfaces and/or barrier functionality are also included within the scope of the present invention.

FIG. 5C illustrates the use of an interface layer 840 between the compound semiconductor device 820 and the silicon layer 808. As discussed previously, the metal-assisted semiconductor/semiconductor bond illustrated in FIG. 5C includes a thin metal layer that provides beneficial functions including improving the robustness of the interface and accommodating CTE differences between the materials bonded to either side of this interface layer. Interface layers can include suitable materials including materials that provide peritectic properties including metals such as InPd, other metal alloys, combinations thereof, or the like. Gettering materials such as Ti or Cr can also be integrated with the interface layer to getter surface oxides and improve bond properties. For thin layers of interfacial metals, light will be able to pass without significant attenuation. The low optical loss provided by embodiments of the present invention include absorption coefficients that can be computed using waveguide models and the measured absorption properties of the interface layer. The use of an interface layer 840 will also provide an ohmic contact between the silicon layer 808 and the compound semiconductor device 820. Thus, embodiments of the present invention provide an interface that is electrically conductive without significant optical absorption.

Although FIGS. 5A-5C illustrate bonding of a compound semiconductor device to an SOI substrate, embodiments of the present invention are not limited to the bonding of a device to a substrate. Other embodiments of the present invention are applicable to substrate to substrate bonding, also referred to as wafer bonding. Thus, the compound semiconductor device illustrated in the figures can be replaced with a compound semiconductor substrate in the processes and structures described herein. One of ordinary skill in the art would recognize many variations, modifications, and alternatives.

As illustrated in FIG. 5C, an interface layer 840 such as a thin layer (e.g., less than 100 Å) of a metal alloy such as $In_xPd_y$, can be used to accommodate some of the CTE mismatch between the two semiconductor materials. In other embodiments, the interface layer is not present and a direct semiconductor/semiconductor bond is formed for Bond 2. Embodiments of the present invention utilize both a metal/metal bond illustrated by Bond 1 and a direct semiconductor/semiconductor bond or an interface assisted semiconductor/semiconductor bond illustrated by Bond 2. Such a hybrid bonding approach utilizes the benefits provided by both types of bonds to reduce or overcome the disadvantages of low temperature semiconductor/semiconductor bonding including the weak interface as well as the disadvantages of metal/metal bonding including high optical loss in the vicinity of the metal/metal bond. Thus, embodiments of the present invention provide for high strength bonds and electrical conductivity (Bond 1) while enabling low optical loss and electrical conductivity in regions of the structure suitable for light propagation (Bond 2).

Figure 6A:
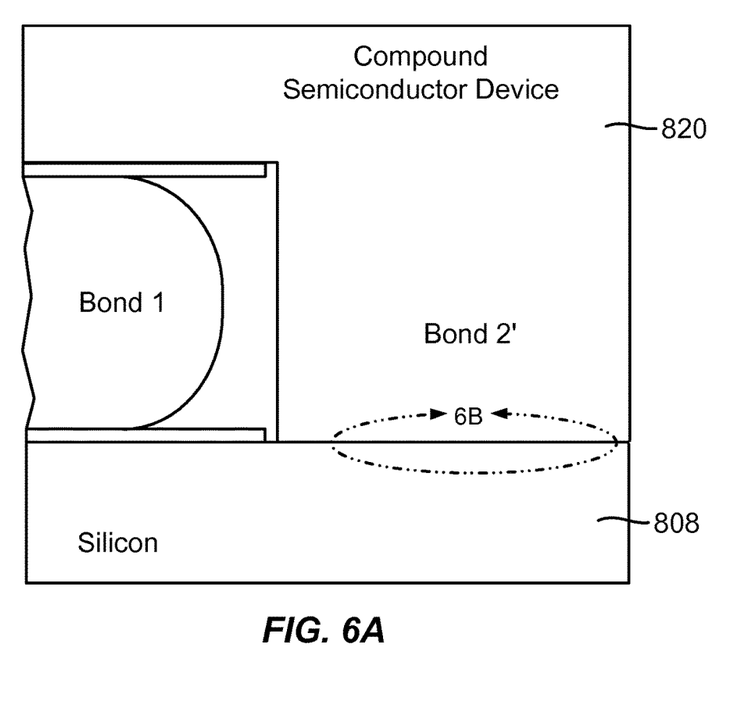
FIGS. 6A-6B are simplified schematic diagrams illustrating bond interfaces according to another embodiment of the present invention.
Figure 6B:
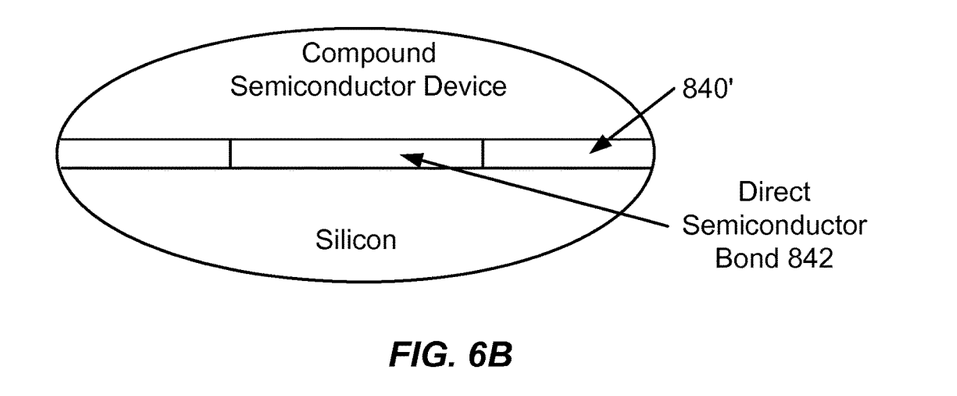

FIGS. 6A-6B are simplified schematic diagrams illustrating bond interfaces according to another embodiment of the present invention. In the case where light propagates parallel to the interface formed at Bond 2 and evanescent coupling is used between the silicon layer 808 and the compound semiconductor device 820, a combination of direct semiconductor-semiconductor bonding and metal-assisted semiconductor-semiconductor bonding may be employed to form Bond 2. This can be achieved by selective patterning of the thin interfacial metal. Referring to FIG. 6A, Bond 2' between the silicon layer 808 and the compound semiconductor device 810 is illustrated. Bond 2' includes not only an interface layer 840' similar to layer 840 in FIG. 5C, but a direct semiconductor-semiconductor bond 842. In the embodiment illustrated in FIG. 6B, the interface layer 840' is patterned to provide regions that are free of the interface layer, which may be a metal layer. As an example, in a light emitting device, the direct semiconductor-semiconductor bond could be positioned adjacent the light emission region to prevent absorption of light by the interface layer. The combination of an interface layer with a direct semiconductor-semiconductor bond thus provides benefits associated with each of the bonding techniques in a hybrid manner.

The bonding processes described herein can be performed in the temperature range from about 350° C. to about 500° C. In a particular embodiment, the temperature associated with the bonding process is in the temperature range of 400° C.-450° C. These temperatures are below the temperature at which CMOS circuits, which may be previously fabricated on the SOI substrate, would be damaged. This enables the integration of complex electrical functions while still providing a robust bond between the dissimilar materials discussed herein.

Figure 7:
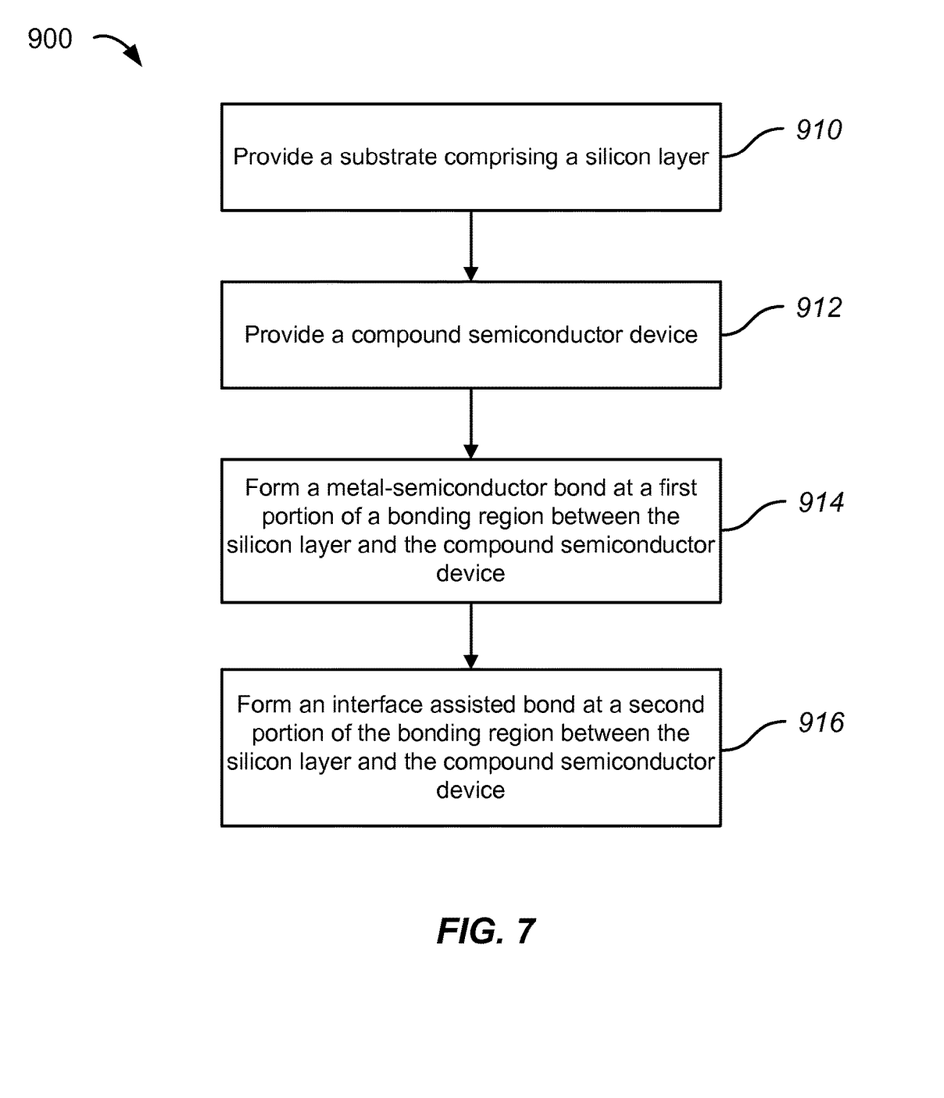
FIG. 7 is a simplified flowchart illustrating a method of fabricating a hybrid semiconductor structure according to an embodiment of the present invention.

FIG. 7 is a simplified flowchart illustrating a method of fabricating a hybrid semiconductor structure according to an embodiment of the present invention. The method 900 includes providing a substrate comprising a silicon layer (910), providing a compound semiconductor device (e.g., an InP semiconductor laser) (912), and forming a bonding region disposed between the silicon layer and the compound semiconductor device. Forming the bonding region includes forming a metal-semiconductor bond at a first portion of the bonding region (914). The metal-semiconductor bond includes a first pad bonded to the silicon layer, a bonding metal bonded to the first pad, and a second pad bonded to the bonding metal and the compound semiconductor device. Forming the bonding region also includes forming an interface assisted bond at a second portion of the bonding region (916). The interface assisted bond includes an interface layer (e.g., $In_xPd_y$) positioned between the silicon layer and the compound semiconductor device. The interface assisted bond provides an ohmic contact between the silicon layer and the compound semiconductor device. In an embodiment, the interface layer has a thickness less than 50 Å.

According to an embodiment, the substrate includes an SOI wafer including a silicon substrate, an oxide layer disposed on the silicon substrate, and the silicon layer is disposed on the oxide layer. In embodiments utilizing a laser or other light generator, the second portion of the bonding region can be substantially free from the interface layer at a position adjacent an active region of the laser or optical generator in order to reduce optical losses. The bonding processes can be performed using low temperature bonding processes, for example, at a temperature ranging from about 350° C. to about 500° C., more particularly, from about 400° C. to about 450° C.

It should be appreciated that the specific steps illustrated in FIG. 7 provide a particular method of fabricating a hybrid semiconductor structure according to an embodiment of the present invention. Other sequences of steps may also be performed according to alternative embodiments. For example, alternative embodiments of the present invention may perform the steps outlined above in a different order. Moreover, the individual steps illustrated in FIG. 7 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 8:
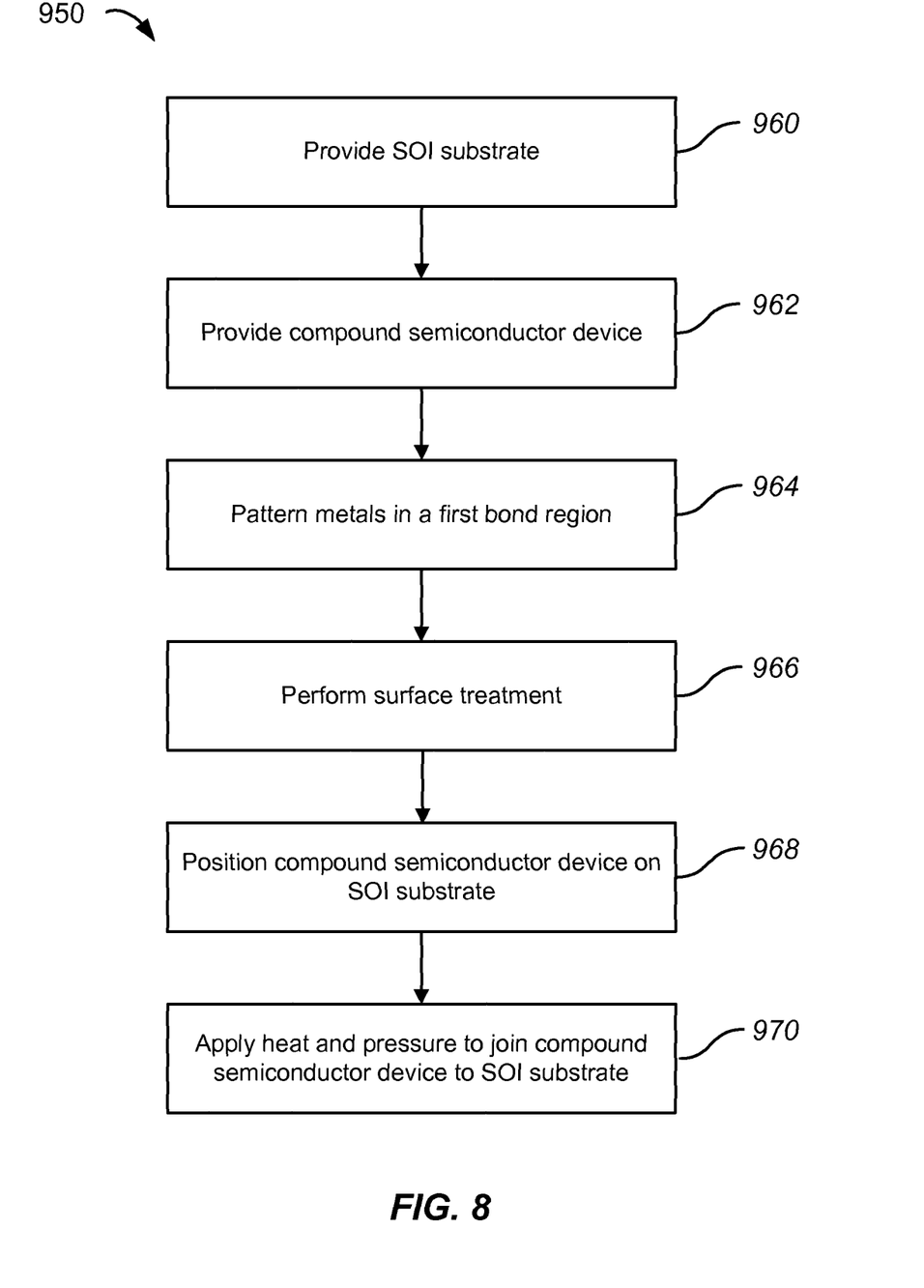
FIG. 8 is a simplified flowchart illustrating a method of fabricating a hybrid semiconductor structure according to another embodiment of the present invention.

FIG. 8 is a simplified flowchart illustrating a method of fabricating a hybrid semiconductor structure according to another embodiment of the present invention. The method 950 includes providing an SOI substrate (960) and providing a compound semiconductor device (962), which can also be referred to as a compound semiconductor die. In an embodiment of the present invention, the SOI substrate includes one or more optical components such as waveguides, optical isolators, reflective structures, or the like and the compound semiconductor device is an InP gain medium.

The method also includes patterning metals in a first bond region (964). The metals can be deposited or formed in a variety of manners. The first bond region can be used for metal-metal bonding and/or for metal-assisted semiconductor-semiconductor bond on one or both materials. After the metals are patterned, a surface treatment is performed (966), for example, a chemical treatment of the surface(s), a plasma activation for a semiconductor-semiconductor bond without metal assist, or the like. The surface treatment can be performed in a controlled atmosphere such as an inert environment, a reduced pressure atmosphere such as a vacuum, or the like. The method further includes positioning the compound semiconductor device on the SOI substrate, such as a receptor site (968) and applying heat and pressure to join the compound semiconductor device to the SOI substrate (970). In an embodiment, the joining step simultaneously effects both metal-based and semiconductor-based bonds.

It should be appreciated that the specific steps illustrated in FIG. 8 provide a particular method of fabricating a hybrid semiconductor structure according to another embodiment of the present invention. Other sequences of steps may also be performed according to alternative embodiments. For example, alternative embodiments of the present invention may perform the steps outlined above in a different order. Moreover, the individual steps illustrated in FIG. 8 may include multiple sub-steps that may be performed in various sequences as appropriate to the individual step. Furthermore, additional steps may be added or removed depending on the particular applications. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:
1. A hybrid integrated optical device comprising:
a substrate comprising a silicon layer;

a first pad, disposed on a first region of the silicon layer and bonded to the silicon layer;
a compound semiconductor device;
a second pad, disposed on a first region of the compound semiconductor device and bonded to the compound semiconductor device; and
a bonding metal, wherein:
the bonding metal comprises $In_{0.7}Pd_{0.3}$;
the bonding metal is disposed between the first pad and the second pad;
the bonding metal is bonded to the first pad and the second pad; and
the bonding metal, the first pad, and the second pad secure the compound semiconductor device to the silicon layer of the substrate;
and wherein:
the substrate and the compound semiconductor bond to form a second bond between a second region of the silicon layer and a second region of the compound semiconductor device, and the second bond is one of:
a direct semiconductor/semiconductor bond, or
a metal-assisted semiconductor/semiconductor bond that includes a metal interface layer having a thickness of less than 100 Å, wherein the metal interface layer is between the second region of the silicon layer and the second region of the compound semiconductor device.

2. The hybrid integrated optical device of claim 1, wherein the bonding metal is $In_{0.7}Pd_{0.3}$.

3. The hybrid integrated optical device of claim 1, wherein:
the first pad comprises at least one of Ti, Cr, Pt, Ni or W; and
the second pad comprises at least one of Ti, Cr, Pt, Ni or W.

4. The hybrid integrated optical device of claim 1, wherein the substrate is a silicon-on-insulator substrate comprising a silicon handle portion, an oxide layer, and the silicon layer.

5. The hybrid integrated optical device of claim 1, wherein:
the second bond is the metal-assisted semiconductor/semiconductor bond;
the silicon layer includes a third region;
the compound semiconductor device includes a third region; and
the third region of the silicon layer and the third region of the compound semiconductor device are bonded by a direct semiconductor/semiconductor bond.

6. The hybrid integrated optical device of claim 5, further comprising a light-emitting device that is operable to emit light through the direct semiconductor/semiconductor bond.

7. The hybrid integrated optical device of claim 6, wherein the light-emitting device is a III-V optical device.

8. The hybrid integrated optical device of claim 6, wherein the light-emitting device is an optical generator.

9. The hybrid integrated optical device of claim 5, wherein light propagates parallel to an interface between the third region of the silicon layer and the third region of the compound semiconductor device, such that the light evanescently couples across the direct semiconductor/semiconductor bond, between the silicon layer and the compound semiconductor device.

10. The hybrid integrated optical device of claim 1, wherein a first portion of the silicon layer forms a recess proximate the first pad, and wherein a top surface of the compound semiconductor device is coplanar with a second portion of the silicon layer.

11. The hybrid integrated optical device of claim 1, further comprising a planarizing material.

12. The hybrid integrated optical device of claim 11, wherein at least a portion of the planarizing material is removed, and further comprising an interconnect metal that provides electrical connectivity to at least one of the compound semiconductor device and the silicon layer, at a location where the portion of the planarizing material is removed.

13. A hybrid integrated optical device comprising:
a first semiconductor comprising a first optical element;
a first pad, disposed on a first region of the first semiconductor and bonded to the first semiconductor;
a second semiconductor comprising a second optical element;
a second pad, disposed on a first region of the second semiconductor and bonded to the second semiconductor; and
a bonding metal, wherein:
the bonding metal is $In_{0.7}Pd_{0.3}$;
the bonding metal is disposed between the first pad and the second pad;
the bonding metal is bonded to the first pad and the second pad; and
the bonding metal, the first pad, and the second pad secure the first semiconductor to the second semiconductor; and
the first optical element is directly optically coupled with the second optical element;
and wherein:
the first semiconductor and the second semiconductor bond to form a second bond between a second region of the first semiconductor and a second region of the second semiconductor, and the second bond is one of:
a direct semiconductor/semiconductor bond, or
a metal-assisted semiconductor/semiconductor bond that includes a metal interface layer having a thickness of less than 100 Å, wherein the metal interface layer is between the second region of the first semiconductor and the second region of the second semiconductor.

14. The hybrid integrated optical device of claim 13, wherein the first optical element is a waveguide.

15. The hybrid integrated optical device of claim 14, further comprising an index matching material that optically couples the waveguide directly with the second optical element.

16. The hybrid integrated optical device of claim 13, wherein:
the first pad comprises at least one of Ti, Cr, Pt, Ni or W; and
the second pad comprises at least one of Ti, Cr, Pt, Ni or W.

17. The hybrid integrated optical device of claim 13, wherein the second semiconductor comprises a gain medium.

18. The hybrid integrated optical device of claim 17, wherein:
the second bond is the direct semiconductor/semiconductor bond, and
the gain medium forms at least part of a light-emitting device that is operable to emit light through the direct semiconductor/semiconductor bond.

19. The hybrid integrated optical device of claim 13, wherein:
   the second bond is the metal-assisted semiconductor/semiconductor bond, and
   the metal-assisted semiconductor/semiconductor bond provides an ohmic contact between the first semiconductor and the second semiconductor.

* * * * *